United States Patent
Hsu et al.

(10) Patent No.: US 12,412,752 B2
(45) Date of Patent: Sep. 9, 2025

(54) METHOD FOR MANUFACTURING GATE INCLUDING BOY PART AND PROTRUDING PART AND GATE STRUCTURE

(71) Applicant: CHANGXIN MEMORY TECHNOLOGIES, INC., Hefei (CN)

(72) Inventors: Cheng-Yeh Hsu, Hefei (CN); Xiao Zhu, Hefei (CN); Xiaohong Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 490 days.

(21) Appl. No.: 17/879,061

(22) Filed: Aug. 2, 2022

(65) Prior Publication Data
US 2023/0343600 A1    Oct. 26, 2023

Related U.S. Application Data

(63) Continuation of application No. PCT/CN2022/093394, filed on May 17, 2022.

(30) Foreign Application Priority Data

Apr. 24, 2022 (CN) .......................... 202210434946.3

(51) Int. Cl.
*H01L 21/311* (2006.01)
*H01L 21/02* (2006.01)
(Continued)

(52) U.S. Cl.
CPC .. *H01L 21/31144* (2013.01); *H01L 21/02304* (2013.01); *H01L 21/485* (2013.01); *H01L 21/762* (2013.01)

(58) Field of Classification Search
CPC ......... H01L 21/31144; H01L 21/02304; H01L 21/485; H01L 21/762
See application file for complete search history.

(56) References Cited

U.S. PATENT DOCUMENTS 4,274,909 A * 6/1981 Venkataraman .... H01L 21/0338
438/296
5,923,981 A    7/1999 Qian
(Continued)

FOREIGN PATENT DOCUMENTS

CN    100590732 C    2/2010
CN    105900242 A    8/2016
(Continued)

OTHER PUBLICATIONS

"Simultaneous Precise Generation of Different FET Channel Lengths During the Sidewall Image Transfer Process", IBM Technical Disclosure Bulletin, International Business Machines Corp. (Thornwood), US, vol. 31, No. 2, Jul. 1, 1988 (Jul. 1, 1988), p. 36/37, XP000110971, ISSN: 0018-8689, the whole document. 2 pages.

(Continued)

*Primary Examiner* — Norman D Richards
*Assistant Examiner* — Sean Ayers Winters
(74) *Attorney, Agent, or Firm* — Syncoda LLC; Feng Ma

(57) ABSTRACT

A method for manufacturing a semiconductor structure and the semiconductor structure are provided. The method for manufacturing a semiconductor structure includes: providing an activated region; forming an initial gate located on the activated region; forming a first mask layer on a top surface of the initial gate, in which a first opening penetrating the first mask layer is provided in the first mask layer, and the first opening at least has opposite two sides extending along a first direction; forming sidewall layers located at least on sidewalls of both sides of the first opening extending in the first direction; removing the first mask layer; patterning the initial gate with the sidewall layers on both sides of the first opening as a mask to form gates.

13 Claims, 30 Drawing Sheets

(51) Int. Cl.
    *H01L 21/48*     (2006.01)
    *H01L 21/762*     (2006.01)

(56) References Cited

U.S. PATENT DOCUMENTS

| | | | | |
|---|---|---|---|---|
| 6,022,815 | A * | 2/2000 | Doyle | H01L 21/823456 |
| | | | | 257/E21.624 |
| 7,709,390 | B2 * | 5/2010 | Olson | H01L 21/0334 |
| | | | | 438/945 |
| 2009/0159977 | A1 | 6/2009 | Itou | |
| 2010/0193917 | A1 * | 8/2010 | Olson | H01L 21/0334 |
| | | | | 257/618 |
| 2015/0024602 | A1 * | 1/2015 | Sant | H01L 21/0337 |
| | | | | 438/703 |
| 2015/0194518 | A1 | 7/2015 | Cheng et al. | |
| 2021/0074848 | A1 * | 3/2021 | Katou | H01L 21/31144 |

FOREIGN PATENT DOCUMENTS

| | | | |
|---|---|---|---|
| CN | 112309978 | A | 2/2021 |
| CN | 113745228 | A | 12/2021 |
| JP | 2004288873 | A | 10/2004 |

OTHER PUBLICATIONS

Supplementary European Search Report in the European application No. 22790202.0, mailed on Oct. 18, 2023. 8 pages.

\* cited by examiner

METHOD FOR MANUFACTURING GATE INCLUDING BOY PART AND PROTRUDING PART AND GATE STRUCTURE

CROSS-REFERENCE TO RELATED APPLICATIONS

This application is a continuation application of International Application No. PCT/CN2022/093394, filed on May 17, 2022, which claims priority to Chinese Patent Application No. 202210434946.3, filed on Apr. 24, 2022. The disclosures of International Application No. PCT/CN2022/093394 and Chinese Patent Application No. 202210434946.3 are incorporated herein by reference in their entireties.

BACKGROUND

Memory is a memory component used to store programs and various data information. Random access memory (RAM) used in general computer systems may be divided into dynamic random access memory (DRAM) and static random-access memory (SRAM). Dynamic random access memory is a semiconductor memory device commonly used in computers, consisting of many repetitive memory cells.

A memory cell typically includes a capacitor and a transistor, different devices, such as sense amplifier, are formed by electrical connections between the different transistors.

However, with the continuous shrinking of the size, the gate is becoming smaller and smaller. In the case of shrinking of the gate, how to achieve the effective connection between the gate and the contact structure has become an urgent problem to be solved.

SUMMARY

Embodiments of the disclosure relate to the field of semiconductor, in particular to a method for manufacturing a semiconductor structure and the semiconductor structure.

According to some embodiments of the disclosure, in one aspect, the embodiments of the disclosure provide a method for manufacturing a semiconductor structure. The method includes: providing an activated region; forming an initial gate located on the activated region; forming a first mask layer on a top surface of the initial gate, in which a first opening penetrating the first mask layer is provided in the first mask layer, and the first opening at least has opposite two sides extending along a first direction; forming sidewall layers located at least on sidewalls of the two sides of the first opening extending in the first direction; removing the first mask layer; patterning the initial gate with the sidewall layers at the two sides of the first opening as a mask to form gates.

According to some embodiments of the disclosure, in another aspect, the embodiments of the disclosure further provide a semiconductor structure. The semiconductor structure includes an activated region; a gate located on the activated region, in which the gate includes a body part extending in the first direction and a protruding part located on one side of the body part, the protruding part is connected with a sidewall of the body part extending along the first direction, and the protruding part and the body part are in an integrated structure; a contact structure located on a surface of the protruding part and electrically connected with the gate.

BRIEF DESCRIPTION OF THE DRAWINGS

One or more embodiments are exemplary illustrated by the figures in the corresponding drawings, which are not to be limiting to the embodiments, and the figures in the drawings are not to be scale limiting unless otherwise stated. In order to more clearly illustrate the embodiments of the disclosure or the technical solution in the conventional technique, a brief description of the drawings required to be used in the embodiments will be provided below. Apparently, the drawings of the following description are merely some embodiments of the disclosure. For a person of ordinary skill in the art, other drawings can be obtained based on these drawings without creative work.

DETAILED DESCRIPTION

The embodiments of the disclosure provide a method for manufacturing a semiconductor structure. Gates are formed by providing an activated region; forming an initial gate located on the activated region; forming a first mask layer on a top surface of the initial gate, in which a first opening penetrating the first mask layer is provided in the first mask layer, and the first opening at least has opposite two sides extending along a first direction; forming sidewall layers located at least on sidewalls of both sides of the first opening extending in the first direction; removing the first mask layer; patterning the initial gate with the sidewall layers on two sides of the first opening as a mask. Two gates can be formed in the same step by using the sidewall layers on both sides of the first opening as a mask, thereby providing a structural basis for subsequent forming transistors and an amplifier.

The embodiments of the present disclosure will be described in detail below with reference to the accompanying drawings. However, those skilled in the art should understand that in various embodiments of the present disclosure, numerous technical details are proposed for a reader to better understand the present disclosure. But even without these technical details and various variations and modifications based on the following embodiments, the technical solutions claimed in the present disclosure may be implemented.

Figure 1:
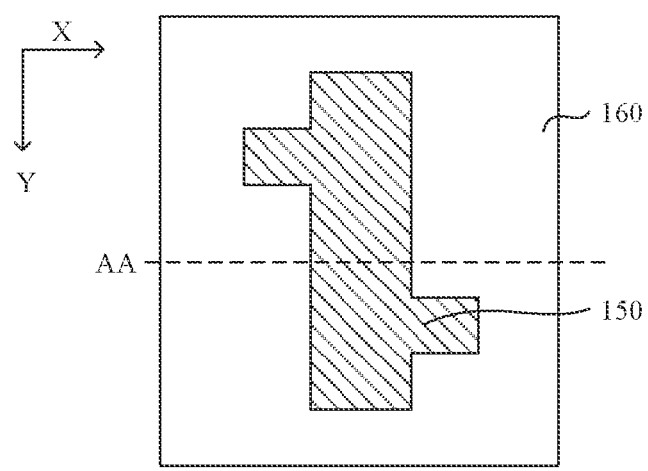
FIGS. 1-14 are structural schematic diagrams corresponding to various operations in a method for manufacturing a semiconductor structure provided by an embodiment of the disclosure.
Figure 2:
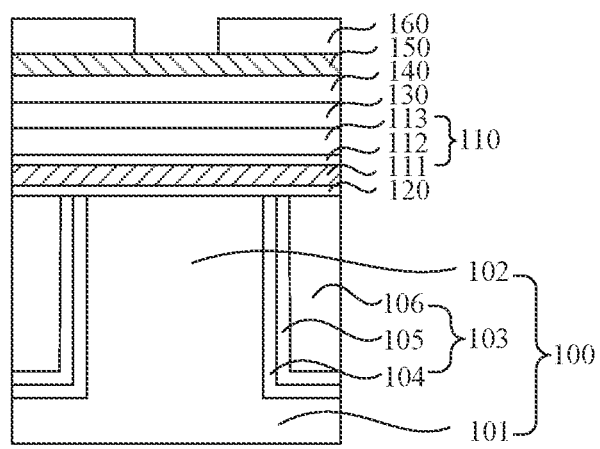

Referring to FIGS. 1 and 2, FIG. 1 is a top view of a semiconductor structure provided by the embodiment of the present disclosure, and FIG. 2 is a sectional view along the AA direction in FIG. 1 provided by the embodiment of the present disclosure.

Specifically, an activated region 100 is provided; an initial gate 110 is formed on the activated region 100.

The activated region 100 may include a substrate 101, an active area 102 located on the substrate 101 and isolation structures 103 located on opposite two sides of the active area 102. The activated region 100 may be patterned to form the active areas 102 spaced apart away each other, and then the material corresponding to the isolation structure 103 is deposited to form the isolation structure 103.

In some embodiments, the material of the substrate 101 may be silicon, germanium, silicon germanium or the like, and the material of the substrate 101 may also be doped. Taken as an example that the material of the substrate 101 is silicon, the substrate 101 is doped with a trace of trivalent elements such as boron, indium, gallium or aluminum, thereby forming a P-type base; Similarly, the substrate 101 is doped with a trace of pentavalent elements, such as phosphorus, antimony, arsenic, or the like, thereby forming an N-type base. The selection of doping elements of the substrate 101 can be considered according to actual requirements and product properties, etc., and the present disclosure does not limit the material of the substrate 101 and the doping elements.

In some embodiments, the isolation structure 103 may include a first isolation structure 104, a second isolation structure 105 and a third isolation structure 106. The material of the first isolation structure 104 may be the same as that of the third isolation structure 106, both are silicon oxide, and the material of the second isolation structure 105 may be silicon nitride, silicon oxynitride, or the like. An ONO structure, i.e. an oxide-nitride-oxide structure, can be formed by forming the first isolation structure 104, the second isolation structure 105 and the third isolation structure 106. By forming the ONO structure, a higher relative dielectric constant, a high breakdown electric field, a low leakage characteristic, and the like can be provided.

In some embodiments, the initial gate 110 may include a first initial conductive layer 111, a second initial conductive layer 112 and an initial protective layer 113 which are stacked, and the first initial conductive layer 111 is located on the top surface of the active areas 102. The material of the first initial conductive layer 111 may be a semiconductor material such as polysilicon, the material of the second initial conductive layer 112 may be a metal material such as tungsten, and the material of the initial protective layer 113 may be an insulating material such as silicon nitride.

Direct transmission of an electrical signal from monocrystalline silicon to tungsten can be avoided by providing the first initial conductive layer 111, thereby reducing the possibility of electrical signal distortion. The transmission speed of an electrical signal of the semiconductor structure can be improved by providing the second initial conductive layer 112 as a metallic material, thereby reducing the response time of semiconductor structure. By providing the first initial conductive layer 111, it can be avoided that the metal of the second initial conductive layer 112 occurs ion diffusion and thus the active area 102 is affected, so that the reliability of the semiconductor structure is improved. By providing the initial protective layer 113, the stress effect on the first initial conductive layer 111 and the second initial conductive layer 112 can be reduced during the manufacturing of the semiconductor structure, thereby protecting the first initial conductive layer 111 and the second initial conductive layer 112.

In some embodiments, before the initial gate 110 is formed, the method further includes forming a gate dielectric layer 120, by which the initial gate 110 and the active areas 102 can be isolated, thereby avoiding direct contact between the gate 110 and the active areas 102.

In some embodiments, after the initial gate 110 is formed, the method further includes forming an initial intermediate layer 130 and an initial isolation layer 140 on the surface of the initial gate 110. The initial intermediate layer 130 is located between the initial isolation layer 140 and the initial gate 110. The material of the initial intermediate layer 130 may be carbon or carbon-containing organic, and the material of the initial isolation layer 140 may be silicon oxynitride.

Forming the initial intermediate layer 130 on the surface of the initial gate 110 can improve the uniformity of the gate subsequently formed, so that the accuracy of subsequent patterning can be improved. However, in some embodiments, the material of the initial intermediate layer 130 is relatively soft, the formed initial intermediate layer 130 has a poor morphology. An initial isolation layer 140 may be formed on the surface of the initial intermediate layer 130, the material of the initial isolation layer 140 is relatively hard and thus the morphology of the initial intermediate layer 130 can be improved by limiting the position of the initial intermediate layer 130. The gate can be prevented from contacting with an etching reagent for removing the first mask layer in the subsequent process of removing the first mask layer by forming the initial isolation layer 140, so that the gate electrode can be protected and the accuracy of patterning can be improved.

In some embodiments, after the initial isolation layer 140 is formed, the method further includes forming a first initial mask layer 150 which provides a process basis for subsequent formation of the first mask layer.

In some embodiments, after the first initial mask layer 150 is formed, the method further includes forming a first photoresist layer 160. The first photoresist layer 160 has at least a first pattern that exposes the surface of the first initial mask layer 150.

The material of the first photoresist layer 160 includes photoresist. Photoresists are classified into positive and negative types according to the images they form. In the photoresist process, after the coating is exposed and developed, the exposed part is dissolved and the unexposed part remains, then the coating material is a positive photoresist. If the exposed part is retained and the unexposed part is dissolved, then the coating material is a negative photoresist.

Embodiments of the present disclosure take a negative photoresist as an example. Trenches are formed on the first photoresist layer 160 by retaining the exposed part.

Figure 3:
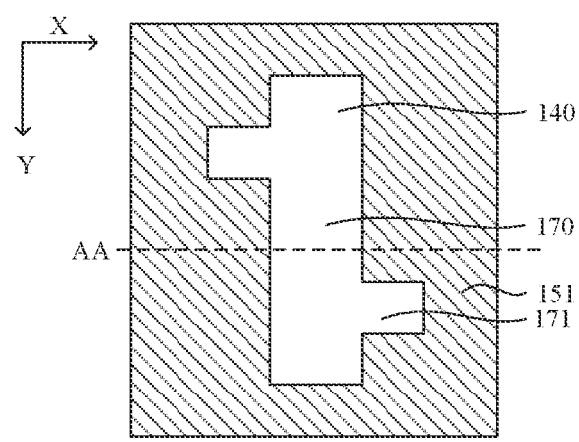
Figure 4:
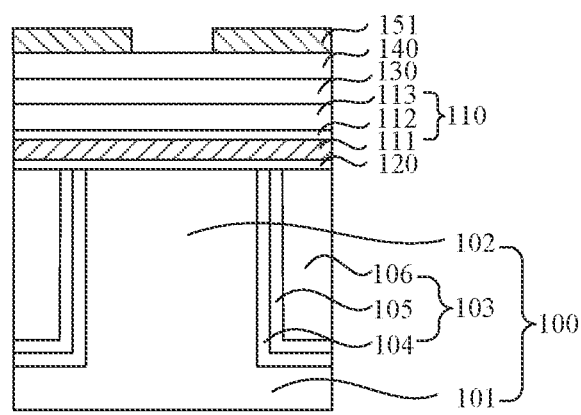

Referring to FIGS. 3 and 4, FIG. 3 and FIG. 4 are operations performed on the basis of FIG. 1 and FIG. 2, and FIG. 4 is a sectional view of FIG. 3 in the AA direction.

The first mask layer 151 is formed on the top surface of the initial gate 110. A first opening 170 penetrating the first mask layer 151 is provided in the first mask layer 151, and the first opening 170 at least has opposite two sides extending along the first direction X.

In some embodiments, the first initial mask layer 150 (referring to FIG. 2) may be patterned with the material of the first photoresist layer 160 (referring to FIG. 2) as a mask, and the remaining part of the first initial mask layer 150 (referring to FIG. 2) serves as the first mask layer 151.

After the first mask layer 151 is formed, the photoresist layer 160 is removed (referring to FIG. 2).

In some embodiments, the first mask layer 151 further includes second openings 171. The second openings 171 are located on opposite two sides of the first opening 170 along the second direction Y and in communication with the first opening 170. The first opening 170 and the second openings 171 provide a process basis for the subsequent formation of the sidewall layer and further provide a process basis for the subsequent formation of the gate.

Figure 5:
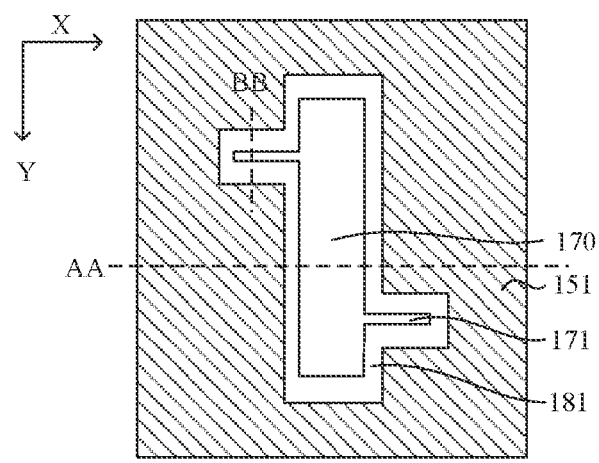
Figure 6:
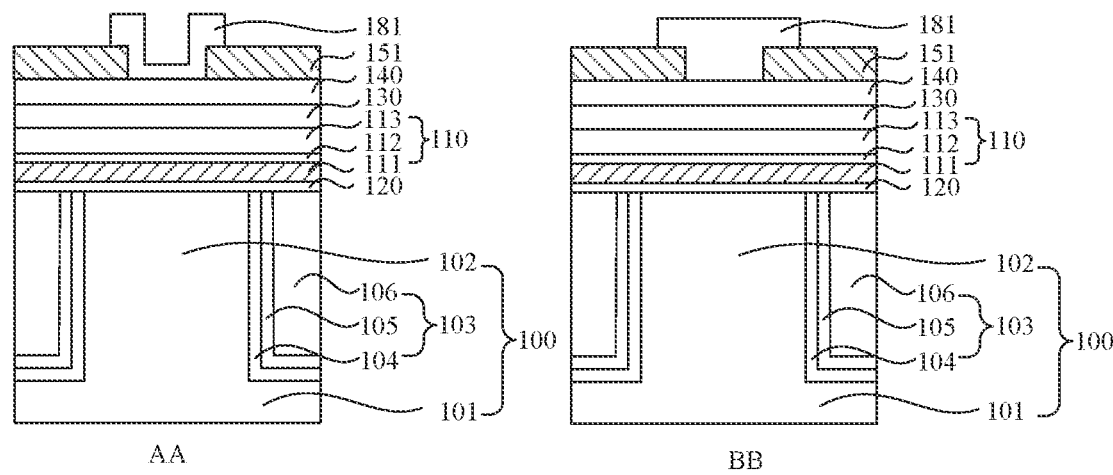
Figure 7:
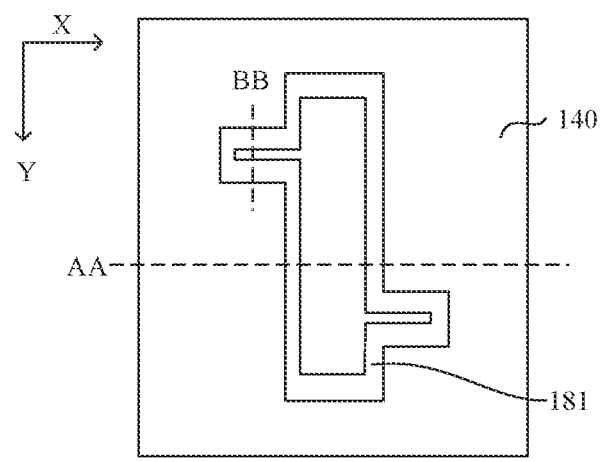
Figure 8:
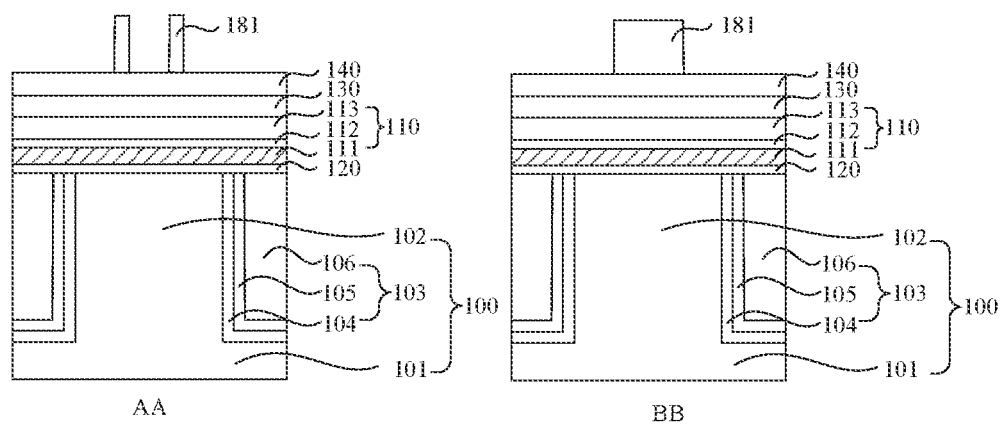
Figure 9:
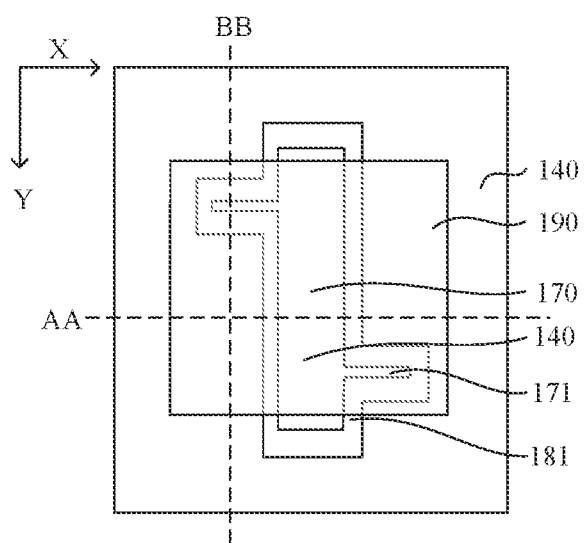
Figure 10:
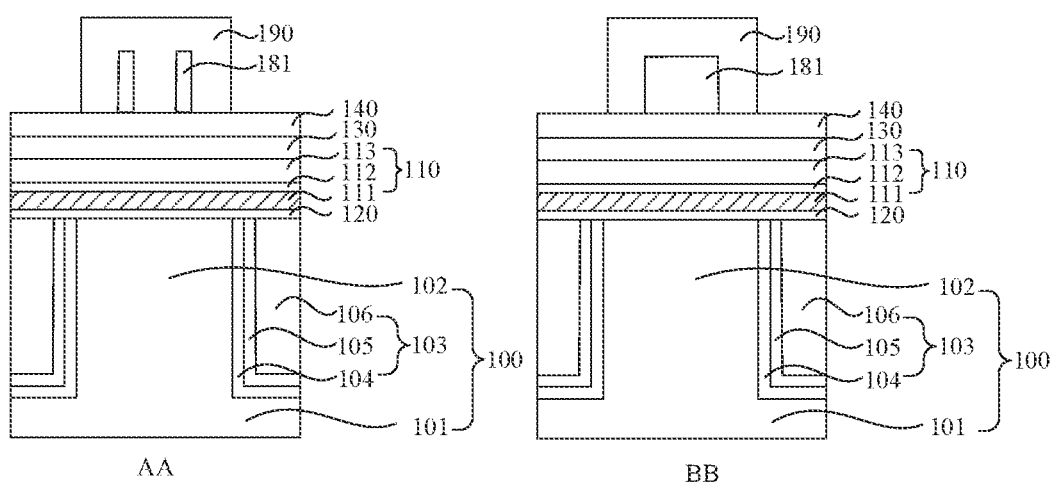
Figure 11:
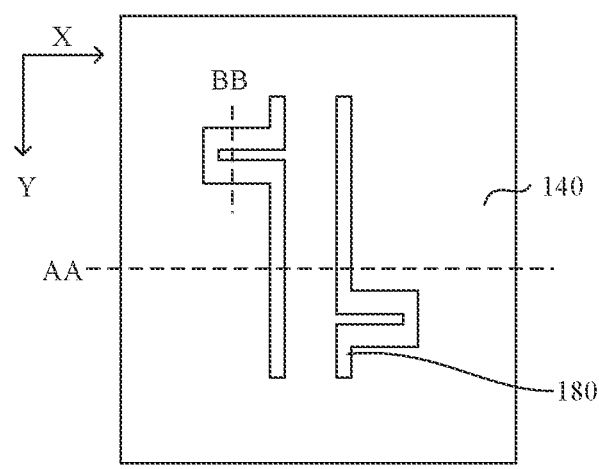
Figure 12:
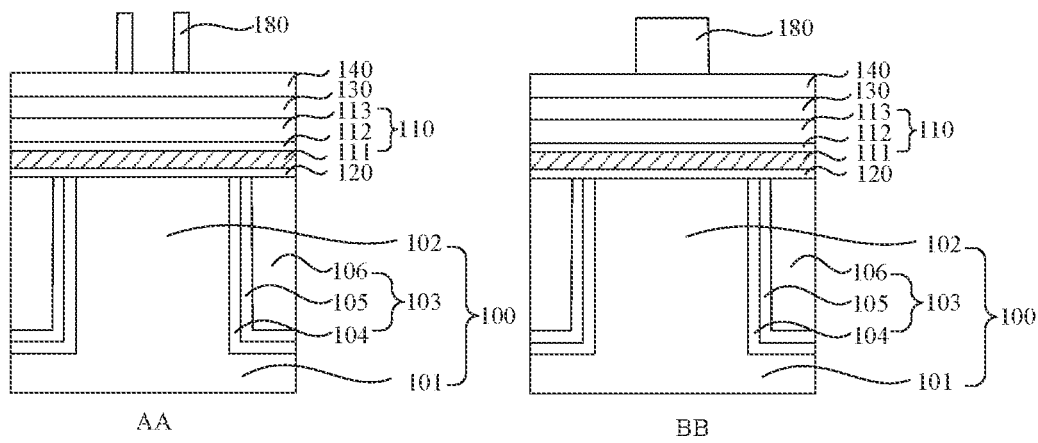

Referring to FIGS. 5 to 12, FIGS. 5 to 12 are operations performed on the basis of FIGS. 3 and 4. FIG. 6 is a sectional view of FIG. 5 along the direction of the dashed line; FIG. 8 is a sectional view of FIG. 7 along the direction of the dashed line; FIG. 10 is a sectional view of FIG. 9 along the direction of the dashed line; FIG. 12 is a sectional view of FIG. 11 along the direction of the dashed line.

Sidewall layers 180 are formed, and the sidewall layers are at least located on sidewalls of both sides of the first opening 170 extending in the first direction X.

In some embodiments, the first mask layer 151 further includes second openings 171, and forming the sidewall layers 180 includes forming the sidewall layers 180 located on the sidewalls of the first opening 170 and the sidewall layers 180 located on the sidewalls of the second openings 171 in the same step.

The sidewall layers 180 on the sidewalls of the second openings 171 provide a process basis for the subsequent formation of the protruding part of the gate, thereby providing a larger contact area for the subsequent formed contact structure to reduce the contact resistance between the contact structure and the gate, and thereby improving the performance of the semiconductor structure.

In some embodiments, in the operation of forming the sidewall layers 180, a sidewall layer 180 that fills up the second opening 171 is formed. By filling up the second opening 171, there is no gap in the protruding part of the gate subsequently formed and the contact area between the protruding part and the contact structure subsequently formed is increased.

In some embodiments, in the second direction, the length of the second opening 171 is larger than the width of the sidewall layer 180 on the sidewall of the first opening 170. It could be understood that, if the length of the second opening 171 is less than the width of the sidewall layer 180, in the process of forming the sidewall layer 180 on the sidewall of the second opening 171, since the length of the second opening 171 is small, the material of the sidewall layer 180 cannot be fully accommodated along the length of the second opening 171, and part of the material of the sidewall layer 180 may accumulate in a direction away from the activated region 100 during deposition, which results in that the surface of the sidewall layer 180 has different heights, and even part of the material of the sidewall layer 180 covers some unnecessary areas, so that the pattern forming the gate subsequently is inaccurate. By providing the length of the second opening 171 larger than the width of the sidewall layer 180 on the sidewall of the first opening 170, the formed sidewall layer 180 can have a better morphology.

In some embodiments, the material of the sidewall layers 180 includes at least one of silica or silicon nitride. Taking the material of the sidewall layer 180 as silicon dioxide as an example, the sidewall layer 180 is formed on the sidewalls of the first opening 170 and the second opening 171 by depositing silica. Since silica is softer, the formed sidewall layer 180 has a good morphology.

Specifically, referring to FIGS. 5 and 6, an initial sidewall layer 181 is formed, which is located on the sidewalls of the first opening 170 and a bottom of the first opening 170, and the top surface of the initial sidewall layer 181 in the first opening 170 is lower than the top surface of the first mask layer 151.

The initial sidewall layer 181 may be formed by depositing silica on the sidewalls of the first opening 170, and the formed initial sidewall layer 181 is lower than the top surface of the first mask layer 151, which may improve the accuracy of the subsequent formation of the sidewall layer, and thus improve the pattern accuracy of the gate subsequent formed, and thereby improving the reliability of the semiconductor structure.

In some embodiments, in the operation of forming the initial sidewall layer 181, an initial sidewall layer 181 is formed on the top surface of the first mask layer 151.

In some embodiments, the first mask layer 151 further includes second openings 171, so that the initial sidewall layer 181 is formed further on the sidewalls of the second openings 171. The formation of the initial sidewall layer 181 on the sidewalls of the second openings 171 provides a process basis for the subsequent formation of the gate having protruding parts, thereby providing more contact area for the contact structure subsequently formed.

In some embodiments, the opening width of the second openings 171 in the second direction Y is larger, so that the filling material of the initial sidewall layer 181 does not fill up the second opening 171 when the initial sidewall layer 181 is formed, and a space is formed in the second opening 171. In other embodiments, the opening width of the second openings 171 in the second direction Y is smaller, so that the filling material of the initial sidewall layer 181 fills up the second openings 171 when the initial sidewall layer 181 is formed.

Referring to FIGS. 7 and 8, the redundant initial sidewall layer 181 and the first mask layer 151 are etched away, so that the remaining initial sidewall layer 181 is only the initial sidewall layer 181 located on the sidewalls of the first mask layer 151, thereby providing a process basis for the subsequent formation of the sidewall layers spaced apart away each other.

The initial sidewall layer 181 located at the part of the bottom of the first opening 171 and the top surface of the first mask layer 151 is removed at the same time by maskless etching process, that is, the initial sidewall layer 181 is formed on the sidewalls of the first opening 171 by a sidewall process (Spacer process), so that the initial sidewall layer 181 with a more accurate pattern can be formed, and the initial sidewall layer 181 formed on the sidewalls of the first opening 171 also defines an opening having a shape similar to that of the first opening 171.

Referring to FIGS. 9 to 12, the initial sidewall layer 181 located at part of the bottom of the first opening 170 (referring to FIG. 5) is removed, and the initial sidewall layer 181 located on opposite sidewalls of the first opening 170 (referring to FIG. 5) in the first direction X is removed to form the initial sidewall layers spaced in a direction perpendicular to the first direction X, and the remaining initial sidewall layer serves as the sidewall layers.

Referring to FIGS. 9 and 10, the process of removing the initial sidewall layer 181 located on opposite sidewalls of the first opening 170 in the first direction X includes: forming a second mask layer 190 after the first mask layer 151 (referring to FIG. 6) is removed, in which the second mask layer 190 exposes the initial sidewall layer 181 on the opposite sidewalls of the first opening 170 along the first direction X.

In some embodiments, the second mask layer 190 also exposes a part of the surface of the initial isolation layer 140. It can be ensured that the initial sidewall layer 181 on the opposite sidewalls of the first opening 170 in the first direction X can be completely exposed by the second mask layer 190 exposing a part of the surface of the initial isolation layer 140, thereby ensuring that the initial sidewall layer 181 on the opposite sidewalls of the first opening 170 in the first direction X can be completely removed in a subsequent etching process. In other embodiments, the second mask layer may not expose the second mask layer inside the first opening, and the present disclosure does not limit the relative positions of the second mask layer 190 and the initial isolation layer 140, only requiring that the initial sidewall layer 181 on the opposite sidewalls of the first opening 170 in the first direction X can be completely exposed.

In some embodiments, the first mask layer 151 (referring to FIG. 6) also includes second openings 171 (referring to FIG. 5), and the second mask layer 190 also covers the entire top surface of the second openings 171 (referring to FIG. 5) to protect the initial sidewall layer 181 on the sidewalls of the second openings 171.

In some embodiments, the material of the second mask layer 190 may be photoresist.

Referring to FIGS. 11 and 12, using the second mask layer 190 (referring to FIG. 10) as a mask, the initial sidewall layer 181 (referring to FIG. 10) located on opposite sidewalls of the first opening 170 (referring to FIG. 5) in the first direction X is removed, and the remaining initial sidewall layer 181 (refer to FIG. 10) serves as the sidewall layers 180. The second mask layer 190 (referring to FIG. 10) is removed. The initial sidewall layer 181 (referring to FIG. 10) is patterned so that the formed sidewall layers 180 are spaced in the second direction Y, and thus two spaced gates are formed in the subsequent process for forming the gates.

In some embodiments, in the operation of forming the sidewall layer 180, the sidewall layers 180 located in the second opening 171 (referring to FIG. 5) define a space, that is, the width of the second opening 171 (referring to FIG. 5) is greater than the sum of the thickness of the sidewall layers 180 on both sides during forming the sidewall layer 180, so that the top surface of the initial isolation layer 140 is also exposed in the second opening 171 (referring to FIG. 5) during forming the sidewall layer 180.

In some embodiments, in the second direction Y, the length of the second openings 171 (referring to FIG. 5) is larger than the width of the sidewall layer 180 on the sidewall of the first opening 170 (referring to FIG. 5). It could be understood that, if the length of the second openings 171 (referring to FIG. 5) is less than the width of the sidewall layer 180, in the process of forming the sidewall layer 180 on the sidewalls of the second openings 171 (referring to FIG. 5), since the length of the second opening 171 (referring to FIG. 5) is small, the material of the sidewall layer 180 cannot be totally accommodated along the length of the second opening 171 (referring to FIG. 5), and a part of the material of the sidewall layer 180 may accumulate in a direction away from the activated region 100 during deposition, as a result, the heights of the surface of the sidewall layer 180 are different, and even some unnecessary areas are covered, so that the pattern of the gate subsequently formed is inaccurate. By providing the length of the second opening 171 (referring to FIG. 5) larger than the width of the sidewall layer 180 on the sidewall of the first opening 170 (referring to FIG. 5), the formed sidewall layer 180 can have a better morphology.

In some embodiments, in the first direction X, the width of the formed gap is 0-5 nm. It could be understood that, the initial gate 110 is patterned with the sidewall layer on the sidewall of the second opening 171 (referring to FIG. 5) as a mask to form a protruding part of the gate. The protruding part is used for contact and connection with the contact structure formed subsequently. When the width of the formed gap is larger, the connection area between the formed contact structure and the protruding part of the gate is smaller; the width of the formed gap is larger, the area of the gate subsequently used for contacting with the contact structure is lager, it is less difficult to form the contact structure on the surface of the gate. When the width of the formed gap is greater than 5 nm, poor contact between the contact structure and the gate may occur. Consequently, by the width of the formed gap being 0-5 nm, and the area of the gate used for the contacting with the contact structure can be enlarged as much as possible without affecting the contact between the contact structure subsequently formed and the gate.

In some embodiments, the width of the formed second opening 171 (referring to FIG. 5) in the first direction is 8-20 times of the width of the gap. It can be understood that the greater the width of the second opening 171 (referring to FIG. 5), the greater the area of the gate for the contacting with the contact structure, whereas the greater the width of the second opening 171 (referring to FIG. 5), the smaller the area on the activated region 100 for forming other structures. Accordingly, the smaller the width of the second opening 171 (referring to FIG. 5), the smaller the area of the gate for the contacting with the contact structure, whereas the smaller the width of the second opening 171 (referring to FIG. 5), the larger the area on the activated region 100 for forming other structures. By controlling the width of the formed second opening 171 to be 8-20 times of the width of the gap, it is possible to reserve an area for forming other structures on the activated region 100 while increasing the area of the gate for the contacting with the contact structure.

Figure 13:
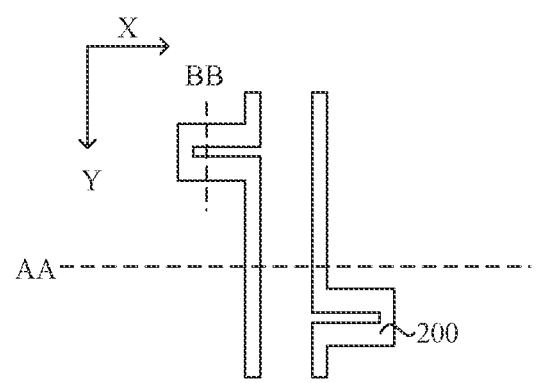
Figure 14:
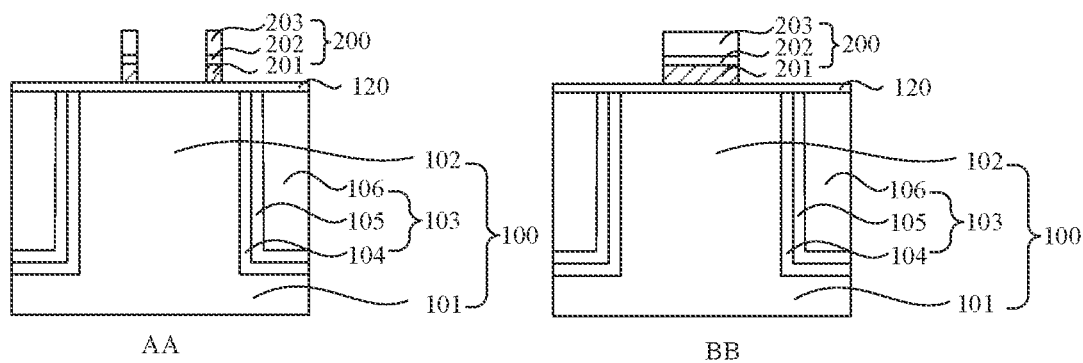

Referring to FIGS. 13 and 14, FIG. 13 and FIG. 14 are operations performed on the basis of FIG. 11 and FIG. 12, and FIG. 14 is a sectional view of FIG. 13 in the direction of the dashed line.

The initial gate 110 is patterned with the sidewall layers 180 on both sides of the first opening 170 (referring to FIG. 5) as a mask to form a gate 200. In some embodiments, the gate 200 includes a body part and a protruding part on one side of the body part for contacting with a contact structure formed subsequently. In some embodiments, before the initial gate 110 is patterned, the operations for forming the gate 200 include the following operations. The initial intermediate layer 130 and the initial isolation layer 140 are patterned with the sidewall layer 180 as a mask, and the remaining initial intermediate layer 130 serves as the intermediate layer, and the remaining the initial isolation layer 140 is used as the isolation layer; the initial gate 110 is patterned with the intermediate layer, the isolation layer and the sidewall layers 180 together as a mask to form the gate 200. By using the intermediate layer, the isolation layer and the sidewall layers 180 together as a mask, the pattern accuracy of forming the gate 200 can be improved, thereby improving the stability of the semiconductor structure.

After the gate 200 is formed, the intermediate layer, the isolation layer and the sidewall layers 180 are removed. That is, in the present disclosure, the feature size of the gate 200 is defined by the width of the sidewall layers 180, so that a smaller feature size of the gate can be obtained and it is more flexible in subsequent circuit design.

An embodiment of the present disclosure also provides another method for manufacturing a semiconductor structure. The manufacturing method is roughly the same as the above-described method, and the main differences is that the mask layer of the semiconductor structure provided in the present disclosure has different patterns, and the structures of the gate formed subsequently are also different. Another method for manufacturing a semiconductor structure provided by the embodiment of the disclosure will be described with reference to the drawings. It should be noted that the same or corresponding parts as the preceding embodiments can refer to the preceding corresponding description, and will not be repeated below.

In this embodiment, taking a positive photoresist as an example, protrusions are formed on the first photoresist and the first mask layer 151 is patterned with the first photoresist layer as a mask.

Figure 15:
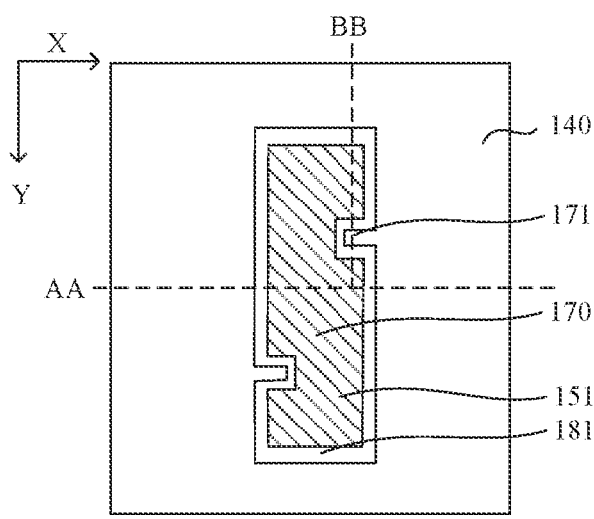
FIGS. 15-18 are structural schematic diagrams corresponding to various operations in another method for manufacturing a semiconductor structure provided by an embodiment of the disclosure.
Figure 16:
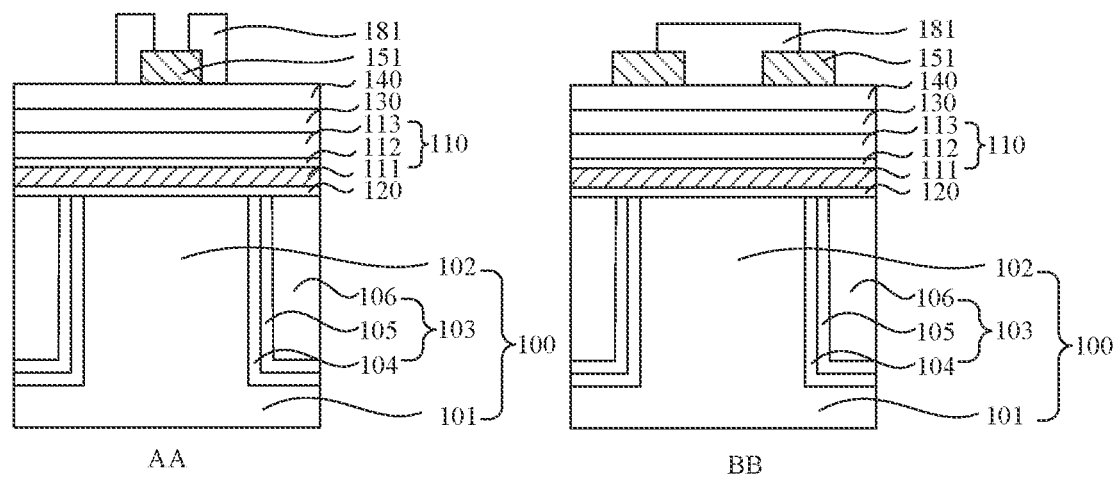
Figure 17:
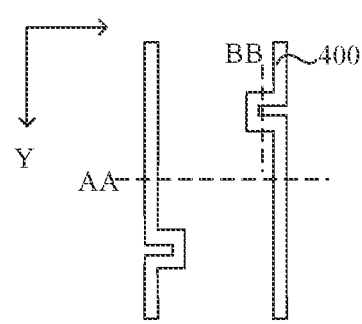
Figure 18:
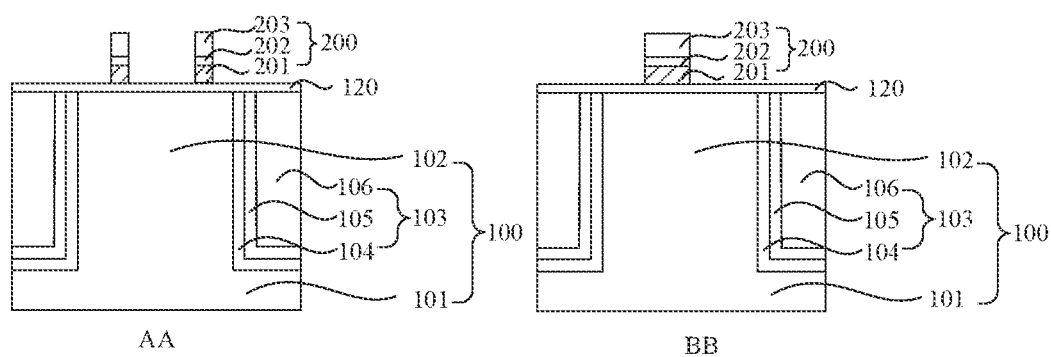

Referring to FIGS. 15 to 18, FIG. 15 is a top view provided by the embodiment of the disclosure. FIG. 16 is a sectional view of FIG. 15 along the direction of the dashed line; FIGS. 17 and 18 are operations performed on the basis of FIGS. 15 and 16, and FIG. 18 is a sectional view of FIG. 17 along the direction of the dashed line.

Specifically, the initial gate 110 is patterned with the first mask layer 151 as a mask, to form two of the gates 200 spaced apart away each other, and the protruding part of one gate 200 faces the other gate 200 located in the same activated region, in other words, the protruding part of one gate 200 is located between the adjacent gates 200.

It should be noted that, since the protruding part needs to be formed between adjacent gates 200, it is necessary to satisfy that the width of the first opening 170 in the first direction X is larger than the sum of the length of the protruding part and the width of the sidewall layers 180, so as to provide a space where the protruding are formed between adjacent gates 200.

In the method for manufacturing a semiconductor structure provided by the embodiment of the disclosure, two of the gates 200 are formed on the same activated region, thereby providing a process basis for subsequent formation of common source or common drain transistors. In addition, a protruding part is formed at one side of the body part of the gate, thereby providing a larger contact area for the subsequent formation of the contact structure, and thus facilitating the subsequent process, and also reducing the contact resistance between the gates 200 and the contact structure, thereby improving the performance of the semiconductor structure.

Another embodiment of the present disclosure also provides a method for manufacturing a semiconductor structure. The method for manufacturing a semiconductor structure is roughly the same as the above-described embodiments, and the main differences is that the gates are formed on different activated region in another embodiment of the disclosure. The method for manufacturing a semiconductor structure provided by another embodiment of the disclosure will be described with reference to the drawings. It should be noted that the same or corresponding parts as the preceding embodiments can refer to the preceding corresponding description, and will not be repeated below.

In this embodiment of the disclosure, taking a positive photoresist as an example, a protrusion is formed on the first photoresist and the first mask layer is patterned with the first photoresist layer as a mask.

Figure 19:
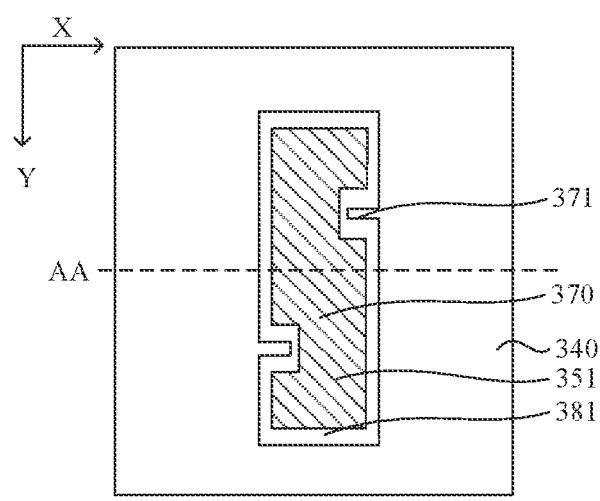
FIGS. 19-24 are structural schematic diagrams corresponding to various operations in a method for manufacturing a semiconductor structure provided by another embodiment of the disclosure.
Figure 20:
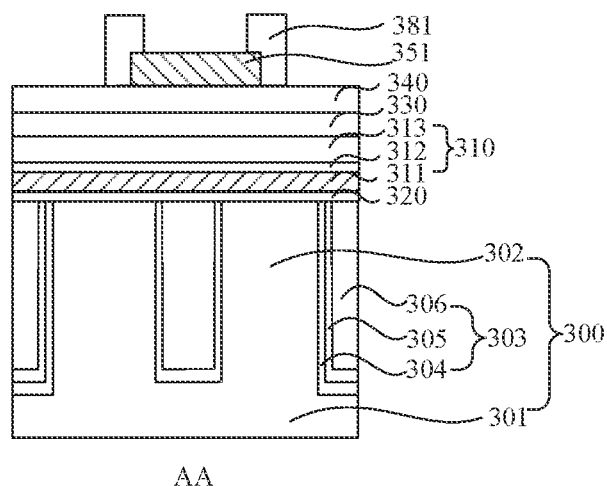
Figure 21:
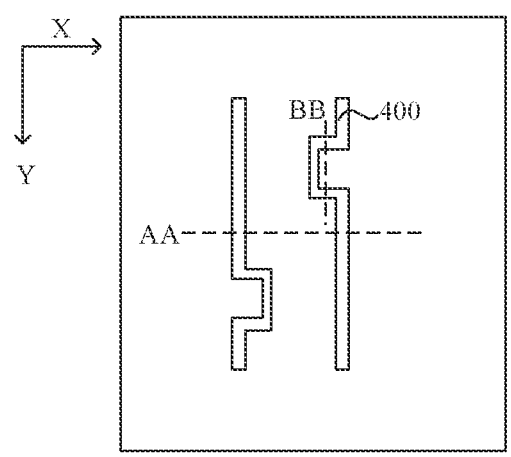
Figure 22:
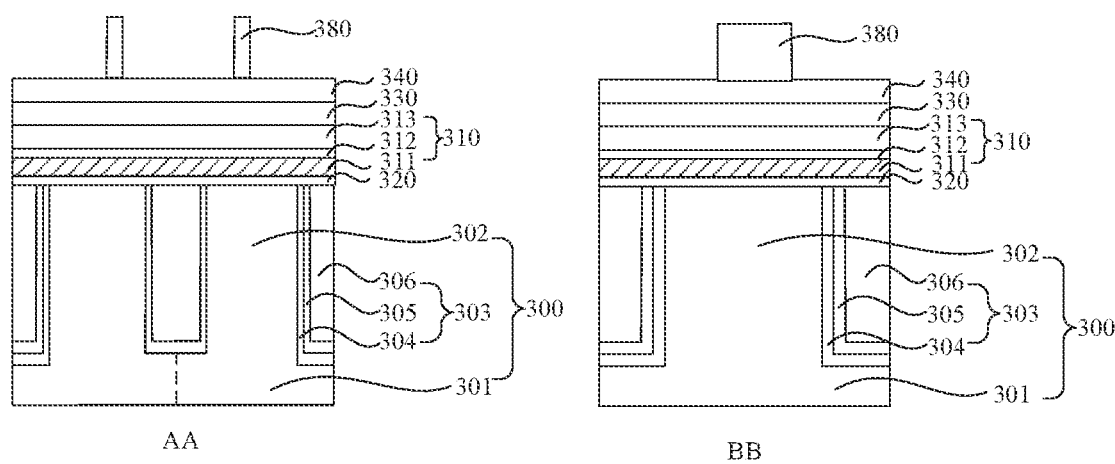

Referring to FIGS. 19 to 22, FIG. 20 is a sectional view of FIG. 19 along the direction of the dashed line, FIGS. 21 and 22 are operations performed on the basis of FIGS. 19 and 20, and FIG. 22 is a sectional view of FIG. 21 along the direction of the dashed line.

Specifically, referring to FIGS. 19 and 20, the activated region 300 may include a substrate 301, an active area 302 located on the substrate 301, and isolation structures 303 located on opposite sides of the active area 302. The isolation structure 303 may include a first isolation structure 304, a second isolation structure 305, and a third isolation structure 306. The initial gate 310 is also provided on the activated region 300. The initial gate 310 may include a first initial conductive layer 311, a second initial conductive layer 312 and an initial protective layer 313 which are stacked. A gate dielectric layer 320 is also included between the initial gate 310 and the activated region 300. An initial intermediate layer 330 and an initial isolation layer 340 are provided, in which the initial intermediate layer 330 is located between the initial isolation layer 340 and the initial gate 310. A first mask layer 351 is provided, which includes a first opening 370; an initial sidewall layer 381 is provided at least on a sidewall of the first opening 370.

In some embodiments, the first mask layer 351 further includes extending parts 371 extending from the first mask layer 351 toward the first opening 370 and connected to opposite sides of the first opening 370 in the second direction Y, and the extending parts 371 are located on different activated regions 300.

It should be noted that the extending parts are equivalent to the second openings in the above-mentioned embodiment. The first mask layer with the extending parts can provide a process basis for forming the protruding parts of the gates subsequently, thereby increasing the areas of the gates subsequently for contacting with the contact structure.

In some embodiments, the width of the formed first opening 370 in the second direction Y is greater than the width of the extending part 371 in the first direction X. By controlling the width of the formed first opening 370 to be larger than the width of the extending part 371, it can be avoided that a part of the material of the initial sidewall layer 381 stacks due to a small space in the process for forming the initial sidewall layer 381.

Referring to FIGS. 21 and 22, the sidewall layers 380 are formed by patterning the initial sidewall layer 381 and the sidewall layers 380 are located on different activated regions 300.

In some embodiments, forming the sidewall layers 380 includes forming the sidewall layers 380 located on the sidewalls of the first opening 370 (referring to FIG. 19) and the sidewall layers 380 located on the sidewalls of the extending parts 371 (referring to FIG. 19) in the same step.

In some embodiments, the first opening 370 crosses adjacent two activated regions 300, and forming the sidewall layers 380 includes forming the sidewall layers 380 above different initial gates 310. By controlling the first opening 370 to cross two adjacent activated regions 300, the gates 400 formed subsequently can be located on different activated regions 300 respectively, which provides a process basis for the subsequent formation of transistors.

Figure 23:
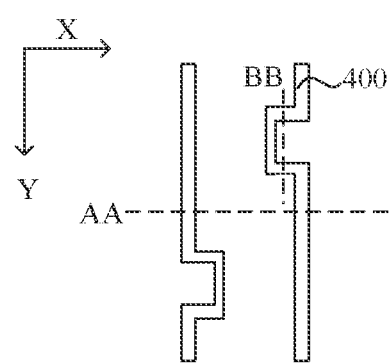
Figure 24:
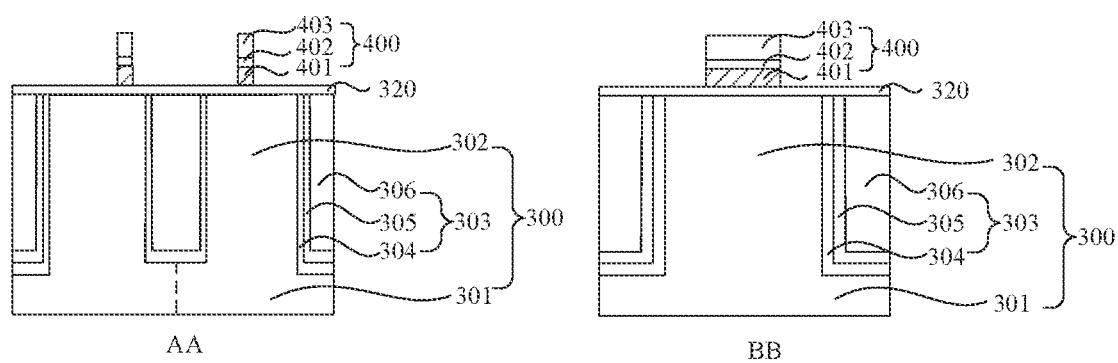

Referring to FIGS. 23 and 24, FIG. 23 and FIG. 24 are operations performed on the basis of FIG. 21 and FIG. 22.

Specifically the initial gate 310 (referring to FIG. 22) is patterned with the sidewall layers 380 as a mask to form gates located on different activated regions.

Another embodiment of the present disclosure also provides another method for manufacturing a semiconductor structure. The manufacturing method is roughly the same as the above-described method, and the main differences is that the mask layer of the semiconductor structure provided in the present disclosure has different patterns, and the structures of the gate formed subsequently are also different. Another method for manufacturing a semiconductor structure provided by the embodiment of the disclosure will be described with reference to the drawings. It should be noted that the same or corresponding parts as the preceding embodiments can refer to the preceding corresponding description, and will not be repeated below.

In this embodiment, taking a negative photoresist as an example, protrusions are formed on the first photoresist and the first mask layer 151 is patterned with the first photoresist layer as a mask.

Figure 25:
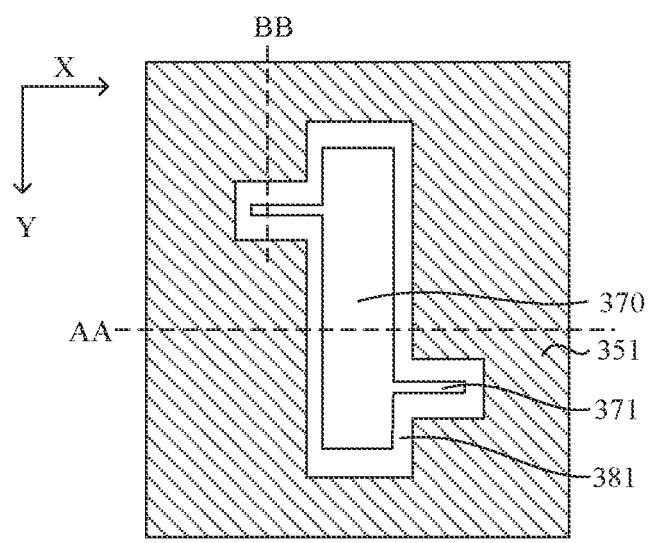
FIGS. 25-28 are structural schematic diagrams corresponding to various operations in another method for manufacturing a semiconductor structure provided by another embodiment of the disclosure.
Figure 26:
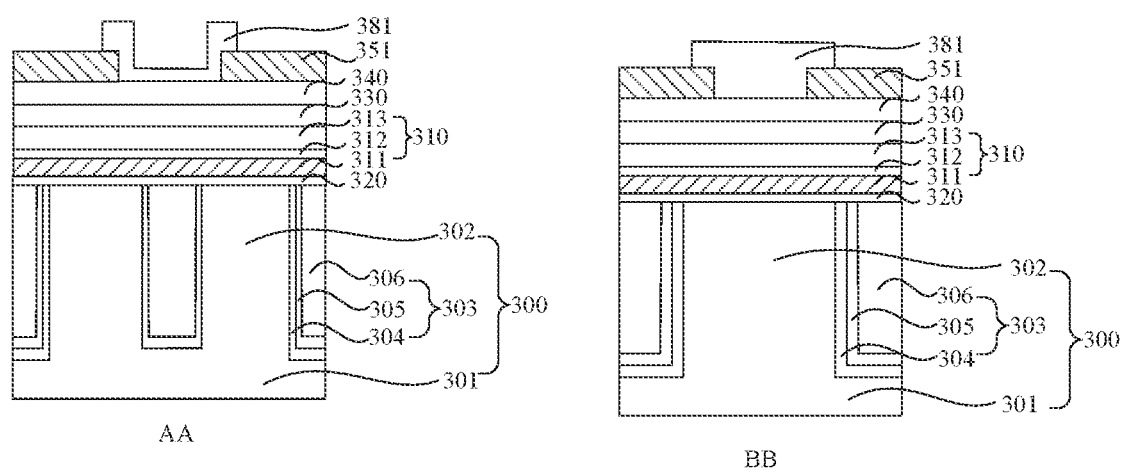
Figure 27:
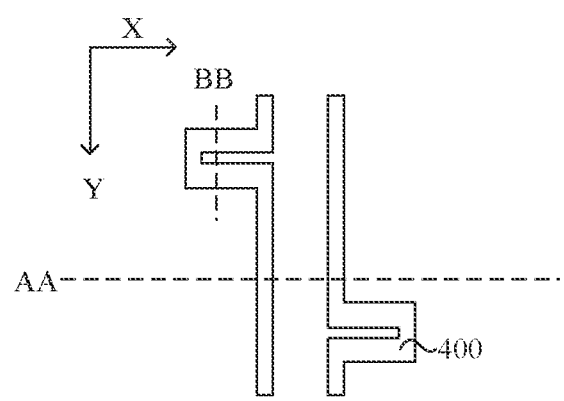
Figure 28:
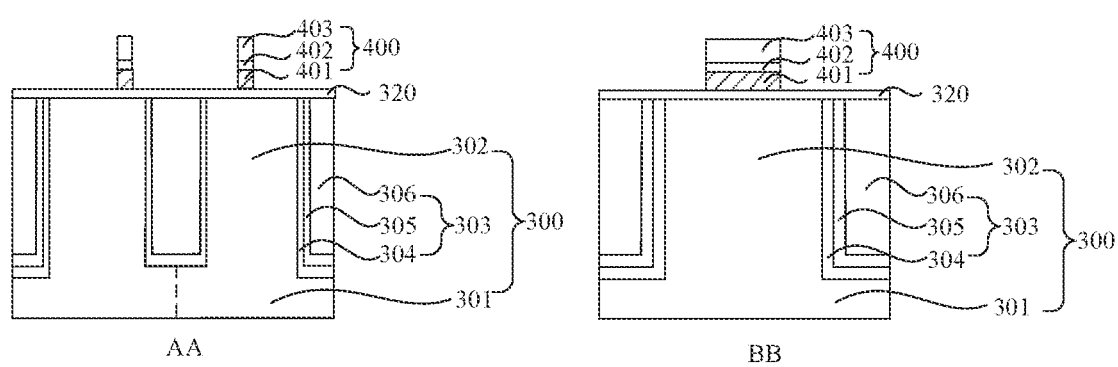

Referring to FIGS. 25 to 28, FIG. 25 is a top view provided by the embodiment of the disclosure. FIG. 26 is a sectional view of FIG. 25 along the direction of the dashed line; FIGS. 27 and 28 are formed on the basis of FIGS. 25 and 26, and FIG. 28 is a sectional view of FIG. 27 along the direction of the dashed line.

Specifically, the initial gate 310 is patterned with the first mask layer 351 as a mask, to form two spaced gates 400, in which the protruding part of one of the gates 400 extends away from another gate 400 located on another activated region, in other words, the protruding parts of the gates 400 are located on the outer sidewall of the adjacent gates 400.

It should be noted that, in the embodiments of the present disclosure, the gates 400 are formed on different activated regions 300. Usually, there is sufficient space for forming the gates 400, such that the width of the first opening 370 is not additionally limited in the embodiment of the present disclosure. In other embodiments, the size of the device is reduced to a certain extent, and there may be insufficient space for forming the gates 400. Therefore, it is necessary to limit the width of the first opening, the length of the protruding parts and the width of the sidewall layers to provide sufficient space for forming the gates.

In the embodiments of the present disclosure, two sidewall layers 380 are formed on different activated regions 300, and the initial gate 310 is patterned with the sidewall layer 380 as a mask, so that two gates 400 spaced apart away each other can be formed, thereby providing a process basis for forming transistors, and the sidewall layers 380 formed by the first mask layer having the extending parts 371 as a mask also has the same protruding parts, thereby providing more contact areas for subsequent formation of the contact structure and improving the reliability of the semiconductor structure.

Embodiments of the present disclosure also provide a semiconductor structure which may be formed using part or all of the above-described operations and the same or corresponding parts may refer to the above-described embodiments and will not repeated below. The semiconductor structure provided by an embodiment of the present disclosure will be described in detail below with reference to the accompanying drawings.

Figure 29:
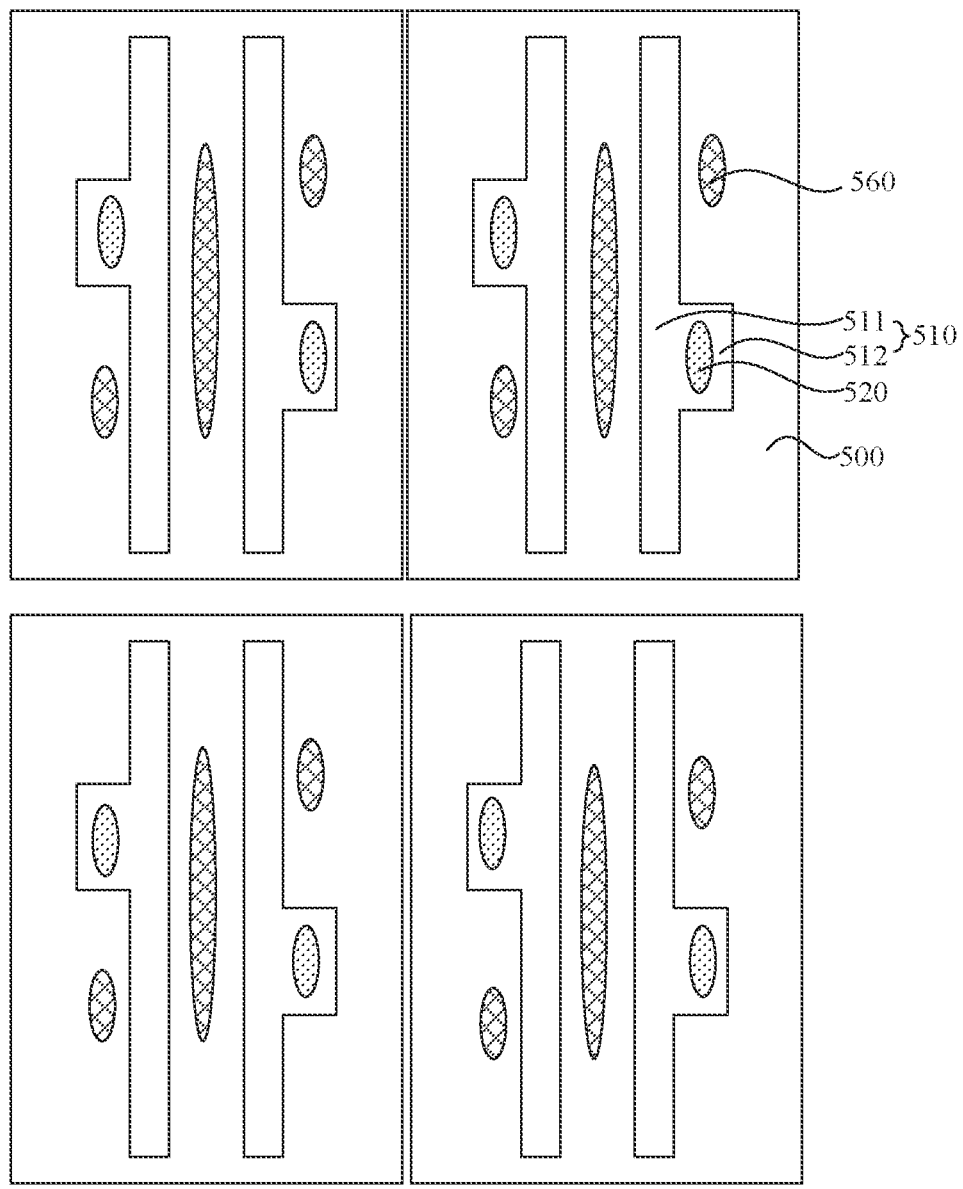
FIG. 29 is a schematic diagram of a semiconductor structure provided by an embodiment of the disclosure.
Figure 30:
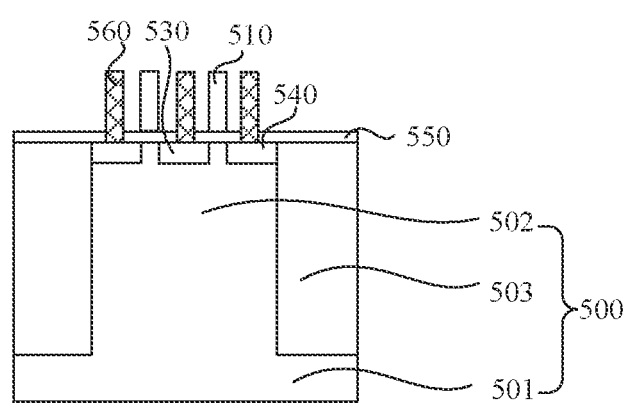
FIG. 30 is a schematic diagram of another semiconductor structure provided by an embodiment of the present disclosure.

Referring to FIGS. 29 and 30, FIG. 29 is a top view of a semiconductor structure provided by the embodiment of the present disclosure, and FIG. 30 is a sectional view provided by an embodiment of the present disclosure.

Specifically, the semiconductor structure includes an activated region 500; a gate 510 located on the activated region 500, in which the gate 510 includes a body part 511 extending in the first direction X and a protruding part 512 located on one side of the body part 511, the protruding part 512 is connected with a sidewall of the body part 511 extending along the first direction X, and the protruding part 512 and the body part 511 are in an integrated structure; a contact structure 520 located on a surface of the protruding part 512 and electrically connected with the gate 510.

In some embodiments, the activated region 500 may include a substrate 501, an active area 502 on the substrate 501 and isolation structures 503 on opposite sides of the active area 502. The semiconductor structure further includes a gate dielectric layer 550 for avoiding contact between the gate 510 and the activated region 500.

By providing the protruding part 512, the contact area between the gate 510 and the contact structure 520 can be increased, thereby reducing the contact resistance between the contact structure 520 and the gate 510, and improving the performance of the semiconductor structure.

In some embodiments, the body part 511 is also provided with a gap therein, and the gap penetrates the body part 511 in the direction of one protruding part 512 toward the body part 511. It could be understood that the larger the gap, the greater the width of the corresponding protruding part 512 in the first direction X, and the width of the protruding part 512 can be increased by forming the gap, thereby increasing the contact area between the gate 510 and the contact structure 520. In other embodiments, the body part 511 may not have a gap and it may be adjusted according to the actual manufacturing process.

In some embodiments, the top surface of one activated region 500 includes two gates 510, and the protruding parts 512 of the two gates 510 are spaced in the first direction X and in the direction perpendicular to the first direction X. By controlling the protruding parts 512 to be spaced in the first direction X and in the direction perpendicular to the first direction X, the subsequent arrangement of the contact structure 520 can be facilitated and subsequent routing can be facilitated. In other embodiments, the protruding part 512 may also be spaced only in the first direction or in the direction perpendicular to the first direction.

In some embodiments, the semiconductor structure further includes a source 530 and a drain 540, in which the source 530 and the drain 540 are located in the activated region 500, and the same source 530 or the same drain 540 are included between two adjacent ones of the gates 510. The activated region is ion doped to form the source 530 and the drain 540, so that a desired common source transistor or a common drain transistor can be formed as required. The common source transistor or the common drain transistor can be used as part of the sense amplifier.

In some embodiments, a plurality of second contact structures 560 are further included, the second contact structures 560 are spaced on the surface of the activated region 500, and one second contact structure 560 is electrically connected to one source 530 or one drain 540. The signals of the source 530 and drain 540 of the transistor can be derived by providing the second contact structures 560.

The materials of the contact structure 520 and the second contact structures 560 may be the same, for example both may be metal.

In the embodiments of the disclosure, by providing the gate 510 having the protruding part 512, the contact area between the contact structure 520 and the gate 510 is increased, thereby reducing the contact resistance between the contact structure 520 and the gate 510, and improving the performance of the semiconductor structure.

Those of ordinary skill in the art will appreciate that the above-described embodiments are specific embodiments for implementing the present disclosure and that in practical application various changes may be made in form and detail thereof without departing from the spirit and scope of the embodiments of the present disclosure. Any person skilled in the art may make their own changes and modifications without departing from the spirit and scope of the embodiments of the present disclosure, so the protection scope of the embodiments of the present disclosure shall be subject to the scope defined by the claims.

The invention claimed is:

1. A method for manufacturing a semiconductor structure, comprising:
providing an activated region;
forming an initial gate located on the activated region;
forming a first mask layer on a top surface of the initial gate, wherein a first opening penetrating the first mask layer is provided in the first mask layer, and the first opening at least has opposite two sides extending along a first direction, the first mask layer further comprises second openings, the second openings are located on opposite two sides of the first opening along a second direction and are communicated with the first opening;
forming sidewall layers located on sidewalls of the two sides of the first opening extending along the first direction and the sidewall layers located on sidewalls of the second openings in a same process;
removing the first mask layer;
patterning the initial gate to form gates, each gate comprises a body part and a protruding part, wherein the body part is formed by the sidewall layers of the two sides of the first opening as a mask, and the protruding part is formed with the sidewall layers of the sidewalls of the second openings as a mask.

2. The method for manufacturing a semiconductor structure according to claim 1, wherein during forming the sidewall layers, the sidewall layer in one second opening defines a gap.

3. The method for manufacturing a semiconductor structure according to claim 1, wherein a length of the second openings is larger than a width of the sidewall layers on sidewalls of the first opening in the second direction.

4. The method for manufacturing a semiconductor structure according to claim 1, wherein a length of the second openings is larger than a width of the sidewall layers on sidewalls of the first opening in the second direction.

5. The method for manufacturing a semiconductor structure according to claim 4, wherein a width of the gap formed in the first direction is 0 to 5 nm.

6. The method for manufacturing a semiconductor structure according to claim 2, wherein a width of the second opening formed in the first direction is 8-20 times of a width of the gap.

7. The method for manufacturing a semiconductor structure according to claim 1, wherein forming the sidewall layers comprises:
forming an initial sidewall layer located on the sidewalls of the first opening and a bottom of the first opening, a top surface of the initial sidewall layer in the first opening being lower than a top surface of the first mask layer; and
removing the initial sidewall layer located at a part of the bottom of the first opening, and removing the initial sidewall layer located on sidewalls of the first opening which are opposite in the first direction to form the initial sidewall layer spaced in a direction perpendicular to the first direction, the remaining initial sidewall layer serving as the sidewall layers.

8. The method for manufacturing a semiconductor structure according to claim 7, wherein during forming the initial sidewall layer, the initial sidewall layer is also formed on a top surface of the first mask layer;
a maskless etching process is adopted to simultaneously remove the initial sidewall layer on the part of the bottom of the first opening and on the top surface of the first mask layer.

9. The method for manufacturing a semiconductor structure according to claim 7, wherein removing the initial sidewall layer located on sidewalls of the first opening which are opposite in the first direction comprises:
forming a second mask layer after removing the first mask layer, the second mask layer exposing the initial sidewall layer on the sidewalls of the first opening along the first direction;
removing the initial sidewall layer on the sidewalls of the first opening which are opposite in the first direction with the second mask layer as a mask; and
removing the second mask layer.

10. The method for manufacturing a semiconductor structure according to claim 1, wherein the first opening crosses two adjacent ones of the activated regions, and forming the sidewall layers comprises forming the sidewall layers above different initial gates.

11. The method for manufacturing a semiconductor structure according to claim 10, wherein the first mask layer further comprises extending parts, wherein the extending parts extend from the first mask layer toward the first opening and are connected with the two sides of the first opening which are opposite in a second direction, and the extending parts are located on different activated regions, and
wherein forming the sidewall layers comprises:
forming the sidewall layers located on the sidewalls of the first opening and the sidewall layers located on sidewalls of the extending parts in a same process.

12. The method for manufacturing a semiconductor structure according to claim 11, wherein a width of the first opening in the second direction is greater than a width of the extending parts in the first direction.

13. The method for manufacturing the semiconductor structure according to claim 1, wherein, forming the gates comprises:
forming an initial intermediate layer and an initial isolation layer on a surface of the initial gate, wherein the initial intermediate layer is located between the initial isolation layer and the initial gate; and
wherein before patterning the initial gate, the method further comprises:
patterning the initial intermediate layer and the initial isolation layer with the sidewall layers as a mask, the remaining initial intermediate layer serving as an intermediate layer and the remaining initial isolation layer serving as an isolation layer; and
patterning the initial gate with the intermediate layer, the isolation layer and the sidewall layers together as a mask to form the gates.

* * * * *